United States Patent
O'Shaughnessy et al.

(10) Patent No.: US 9,432,043 B2
(45) Date of Patent: Aug. 30, 2016

(54) SAMPLE RATE CONVERTER, AN ANALOG TO DIGITAL CONVERTER INCLUDING A SAMPLE RATE CONVERTER AND A METHOD OF CONVERTING A DATA STREAM FROM ONE DATA RATE TO ANOTHER DATA RATE

(71) Applicant: Analog Devices Gobal, Hamilton (BM)

(72) Inventors: Anthony Evan O'Shaughnessy, Glounthaune (IE); Colin Lyden, Baltimore (IE); Joseph Peter Canning, Bandon (IE)

(73) Assignee: Analog Devices Global, Hamilton (BM)

( * ) Notice: Subject to any disclaimer, the term of this patent is extended or adjusted under 35 U.S.C. 154(b) by 76 days.

(21) Appl. No.: 14/496,980

(22) Filed: Sep. 25, 2014

(65) Prior Publication Data

US 2016/0094240 A1  Mar. 31, 2016

(51) Int. Cl.
*H03M 7/00* (2006.01)
*H03M 1/12* (2006.01)
*H03H 17/06* (2006.01)

(52) U.S. Cl.
CPC ........ *H03M 1/1245* (2013.01); *H03H 17/0621* (2013.01); *H03H 17/0642* (2013.01); *H03H 17/0685* (2013.01)

(58) Field of Classification Search
USPC .................................................. 341/61, 123
See application file for complete search history.

(56) References Cited

U.S. PATENT DOCUMENTS

| | | | |
|---|---|---|---|
| 5,191,334 A * | 3/1993 | Yasuda | H03H 17/0664 341/61 |
| 5,903,232 A * | 5/1999 | Zarubinsky | H03H 17/0685 341/61 |
| 5,916,301 A | 6/1999 | Rothacher | |
| 6,081,216 A * | 6/2000 | May | H03M 3/462 341/143 |
| 6,362,755 B1 * | 3/2002 | Tinker | G11B 20/10527 341/61 |
| 6,847,313 B2 * | 1/2005 | Biswas | H03H 17/0275 341/61 |
| 7,236,110 B2 * | 6/2007 | Antonesei | H03H 17/0685 341/61 |
| 7,324,025 B1 * | 1/2008 | Ding | H03H 17/0671 341/61 |

FOREIGN PATENT DOCUMENTS

WO    2006053156 A1    5/2006

\* cited by examiner

*Primary Examiner* — Khai M Nguyen
(74) *Attorney, Agent, or Firm* — Schwegman Lundberg & Woessner, P.A.

(57) ABSTRACT

It is known to perform sample rate conversion. A sample rate converter is arranged to receive digital data at an input sample rate $F_s$ and to output data at an output sample rate $F_o$, where $F_o = F_s/N$, and N is decimation factor greater than 1. A problem can arise with sample rate converters when a user wishes to change the decimation rate. Generally a sample rate converter needs to discard the samples in its filter when the decimation rate is changed, and the filter output is unusable until the filter has refilled with values taken at the new decimation rate. The sample rate converter provided here does not suffer from this problem. The sample rate converter includes at least Q channels. Each channel comprises a Qth order filter arranged to select input signals at predetermined intervals from a run of P input signals, and to form a weighted sum of the selected input signals to generate an output value, and where the runs of P input signals of one channel are offset from the runs of P signals of the other channels.

20 Claims, 11 Drawing Sheets

FIG. 9

SAMPLE RATE CONVERTER, AN ANALOG TO DIGITAL CONVERTER INCLUDING A SAMPLE RATE CONVERTER AND A METHOD OF CONVERTING A DATA STREAM FROM ONE DATA RATE TO ANOTHER DATA RATE

FIELD

This disclosure relates to an apparatus for and method of converting a data stream from one sample rate to another. This disclosure also relates to an analog to digital converter, such as a sigma delta converter including a data rate conversion section.

BACKGROUND

It is known that analog to digital converters can be used to digitize an input signal. It is also known to analyze and compare parameters of repetitive wave forms using processing techniques such as Fourier transform analysis. In some forms of analysis users wish to have a constant number of sampling points across a single cycle of the repetitive waveform, such as a sinusoid, even if the fundamental frequency of the waveform varies slightly. Such an analysis may be performed, for example, by power distribution companies in order to monitor the performance of the electricity generating and supply systems. The electricity is supplied at a nominal frequency, typically of around 50 Hz or 60 Hz. However in reality the supply frequency may vary over a limited but allowable range. This requires the rate at which data samples are produced by an analog to digital converter to be varied in order that the same number of sample points occur in a single cycle.

SUMMARY

According to a first aspect of this disclosure there is provided a sample rate converter arranged to receive digital data at an input sample rate $F_s$ and to output data at an output sample rate $F_o$, where $F_o=F_s/N$, and N is decimation factor greater than 1. The sample rate converter includes at least Q channels. Each channel comprises a filter arranged to select input signals at predetermined intervals from a run of P input signals, and to form a weighted sum of the selected input signals to generate an output value, and where the runs of P input signals of one channel are offset from the runs of P signals of the other channels. Advantageously the filter has an order L.

Advantageously the decimation factor N is user programmable, and may be counted out by a counter which counts the number of input samples received at the input sample rate, Fs.

Each channel may include a suitable data processing means in order to form the weighted sum of the selected input signals. In some embodiments the data processing circuit may be formed as a multiply and accumulate circuit (MAC). For speed and reliability the multiply and accumulate circuit may be provided as dedicated hardware. However software based or hybrid solutions may also be used.

The selected one of the input samples may be identified by counting the number of input samples that have arrived since an arbitrary reference. In an embodiment of the filter and sample rate converter, the filter is a $Q^{th}$ order filter (L=Q) and at least Q+1 samples are combined to form the weighted average. Where Q+1 samples are combined each one of the Q+1 samples is separated from another one of the samples by S input samples, where S is an integer equal to or similar to N. In some embodiments S is an integer lying in the range N−1 less than or equal to S less than or equal to N+1.

Other filter orders or designs may be used if required or desired. Furthermore, the performance of the filter can be modified to vary the value of N in each one of the stages. It may also be advantageous when selecting the filter response as, simplistically, each value of N (or S) places a notch in the filter response, and using slightly different values of N (or S) from one stage to the next allows the filter response (such as the notch positions from each stage) to be varied slightly.

Advantageously each of the channels is selected in turn to give an output. Preferably the outputs of the channels are equally spaced in time with respect to the input sampling rate when working at a given (non-changing) decimation rate.

In some embodiments each of the channels may include two or more processing circuits, each arranged to form a respective weighted sum of selected input signals, wherein the input signals for each one of the processing circuits in a given channel are offset in time from the other input signals used by another one of the processing circuits in the given channel. The offset is generally a low number of input signals. In some embodiments the offset from one signal processing circuit within a channel to the next signal processing circuit within a channel is 1 (one) input signal sample. The use of multiple processing circuits within a channel enables the results from the processing circuits to be combined in order to synthesize non-integer decimation factors. An interpolation factor may be calculated and added to the output of one of the channels in order to calculate the output of a non-integer decimation factor. If necessary the results may be extrapolated rather interpolated.

The output of a result from a channel may be deliberately delayed in order to improve temporal alignment in provision of output results amongst the channels.

Preferably the decimation factor may be updated by a user "on the fly" without incurring a settling time or giving rise to a window in which the data is unusable or unreliable. In order to achieve this each channel which is in the act of calculating an output sample is allowed to continue to complete its calculations using a pre-existing decimation factor. However, once a new decimation factor has been requested, a channel that has finished its calculation becomes available to start calculations based on the new decimation factor. The channel may be loaded directly with the new decimation factor. Thus, when moving from one decimation rate to another decimation rate there is no need to wait for the data in the filter to flush out and refill before the output of the filter can be used again.

In accordance with a further embodiment there is provided an analog to digital converter including a filter sample rate converter as described with respect to the first aspect.

In accordance with a further aspect of this disclosure there is provided a method of performing sample rate conversion, comprising receiving an input signal to be decimated, and processing the signal in at least Q channels, each channel comprising Q differentiators arranged in series, and where each channel selects at least Q+1 input signals from the P signals to form a weighted sum, and the runs of P signals for each channel are offset from each other.

BRIEF DESCRIPTION OF THE DRAWINGS

Embodiments of sample rate converters, and circuits employing such sample rate converters will now be described, by way of non-limiting example only, with reference to the accompanying drawings, in which:

FIG. 9 shows a second updated sequence when transitioning between old and new data rates;

DETAILED DISCLOSURE

As noted in the introduction, it may be useful to monitor the performance of a system. Thus, if an electricity company wished to monitor a voltage supply having a nominal frequency of 50 Hz with a resolution equivalent to one degree in a phasor diagram, then to obtain 360 samples per cycle, the analog to digital converter would need to sample at 18 KHz. However, the electricity companies are typically allowed to let the frequency drift to accommodate changes in load. If a drift of 3% was allowed to occur, then the number of samples occurring in one cycle would differ from the example of 360 given above, and could drop to 349.5 or increase to 371.1 samples per cycle.

For analysis purposes it can be convenient to work with a constant number of samples per cycle, even though the input frequency may change.

It would be generally inconvenient to keep adjusting the sample rate as the sampling clock may be tied to other system clocks.

It is therefore advantageous to allow sample rate conversion to be done such that a series of samples occurring at an input sample rate, which may be a constant (but in some systems need not be) can be converted to a different sample rate. This conversion involves sampling the input signal at an input sample rate which is higher than the output sample rate. The difference is the decimation factor N. N need not be an integer, and may be quite large. In general N can take any value greater than one. In the context of power line monitoring systems N may be in the range of several hundred to one thousand, with typical values being around 600 to 700.

Thus the sampling rate may need to be much higher, for example around the 1 million samples per second mark.

This is not particularly onerous, as sigma-delta converters having an input sample rate of 8 MHz and above are available from Analog Devices.

Figure 1:
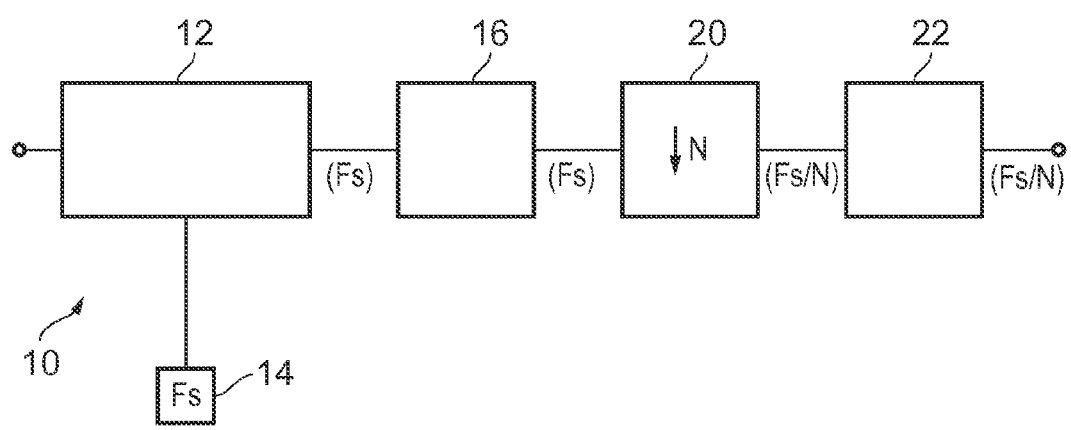
FIG. 1 is a block diagram of an analog to digital converter including a sample rate conversion stage.

FIG. 1 is a block diagram of an analog to digital converter including means for adjusting an output sample data rate without needing to adjust an input clock rate. The analog to digital converter, generally designated 10, comprises a $\Sigma\Delta$ (sigma delta) input stage 12 driven at a sample rate $F_s$ from a sample clock 14. As is known to the person skilled in the art, the sigma delta converter outputs one or more pulse trains at the clock frequency $F_s$ to one or more inputs of an integrator 16. For diagrammatic simplicity only a single signal path has been shown between the sigma delta converter 12 and the integrator 16, but the signal path may in fact comprise a plurality of data paths each at the clock frequency $F_s$. The integrator 16 may comprise a chain of integrators. Each integrator may have to hold a relatively large positive or negative value without suffering an overflow or underflow. However, as known to the person skilled in the art, it may be permissible to allow the integrator to overflow and to wrap around in a sinc filter. Therefore the data width of the integrators within the integrating block 16 may get progressively bigger from one integrator to the next integrator. An output of the integration block 16, which may now be a multibit word is provided to a decimator 20. The decimator 20 has a decimation factor N. Where, for simplicity, the decimation factor N is an integer, it is known to count every Nth output from the integrator 16 and to allow that to pass from the output of the decimator 20 to the input of a differentiator 22. The differentiator 22 comprises a plurality of cascaded differentiators, with the number of differentiators being chosen generally to match the number of integrators. The circuit (excluding the sigma-delta converter) can be implemented entirely in digital hardware.

FIG. 1 also shows, in parentheses, the data rate of the output of each one of the circuit elements. Therefore the data rate at the output of the sigma delta analog to digital converter 12 is $F_s$. The data rate at the output of the integrator 16 is also $F_s$. The data rate at the output of the decimator is $$\frac{F_s}{N}$$

as is the data rate at the output of the differentiator.

Figure 2:
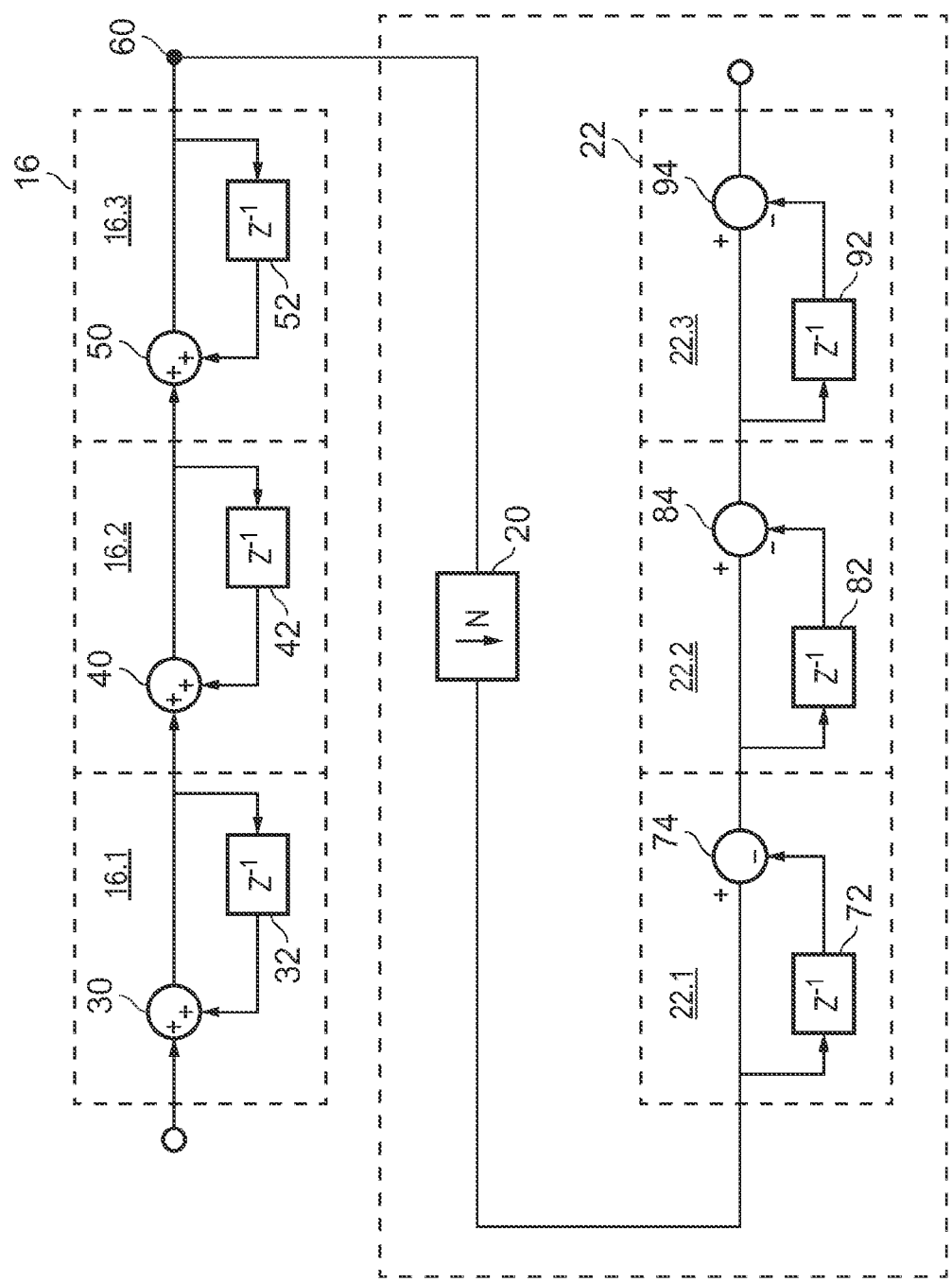
FIG. 2 is a circuit diagram showing the configuration of a known sample rate conversion stage.

FIG. 2 schematically illustrates a circuit operable to perform the functions of the integrator 16, the decimator 20 and the differentiator 22 in greater detail. These components receive the output of the analog to digital converter 12.

In this example, the integrator 16 comprises three first order integration stages arranged in sequence. The first integration stage 16.1 comprises a first summer 30 in association with a first delay element 32. The delay element 32 receives the output of the summer 30, and latches it, making the signal available at the output of the delay element 32 one clock cycle later or more strictly one input sample later. This is known to the person skilled in the art and indicated using the standard notation $Z^{-1}$. An output of the first integrator 16.1 is provided to a first input of a summer 40 of the second integrator 16.2. An output of the summer 40 is provided to a delay element 42 which serves to latch the output of the summer 40, and then output that value one clock cycle later, returning it to a second input of the summer 40. Similarly a third integrator 16.3 comprises a summer 50 and a delay element 52. An output of the summer 40 is provided to a first input of the summer 50. An output of the summer 50 is provided to an input of delay element 52, and the output of the delay element 52 is provided to a second input of the summer 50. Each of the summers 30, 40 and 50 may be implemented digitally as multibit summers, and each of the delay elements 32, 42 and 52 may be implemented digitally by a multibit latch, such as a multibit D type latch. Thus an integrated signal is available at output node 60 of the integrator 16.

In use the value at the output of the integrator 16 updates at the clock rate $F_s$. This relatively rapidly changing signal is provided to an input of a decimator 20, which may be arranged to count the arrival of each output signal from the integrator 16 and select every Nth one for onward propagation to the differentiator 22. The differentiator 22 comprises a plurality of differentiation stages, one for each of the integration stages, as known to the person skilled in the art. The first differentiation stage 22.1 comprises a delay element 72 introducing a $Z^{-1}$ delay (which now corresponds to the output rate of the decimator) and a subtractor 74. The input signal to the first differentiation stage 22.1 is provided both to the input of the delay element 72 and to a non-inverting input of the subtractor 74. An output of the delay element 72 is provided to the inverting (subtracting) input of the subtractor 74, which forms a difference between its two inputs and outputs the result to a second differentiator 22.2. The second differentiator 22.2 comprises a subtractor 84 and a delay element 82 configured as described with respect to the first stage. The output from the second stage is provided to third differentiator 22.3 comprising a delay element 92 and a subtractor 94 configured in the same way as described with respect to the first stage 70. In a digital implementation where the sign of a number is represented by a "sign" bit the subtractor in a stage may be replaced by a summer and the sign bit may be passed through an inverter.

This circuit arrangement is known as a Hogenauer circuit. The transfer function as known to the person skilled in the art is:

$$\left(\frac{1}{N} \times \frac{1-Z^{-N}}{1-Z^{-1}}\right)^Q \quad \text{(eqn 1)}$$

where Q is the order of the circuit.

For the third order Sinc filter as shown in FIG. 2, this can be written as:

$$\left(\frac{1}{1-Z^{-1}}\right)^3 \times (1-Z^{-N})^3 \times \frac{1}{N^3} \quad \text{(eqn 2)}$$

The first term in equation 2 represents the integration term, the second term in equation 2 represents the differentiation, and the third term represents a scaling factor.

Figure 3:
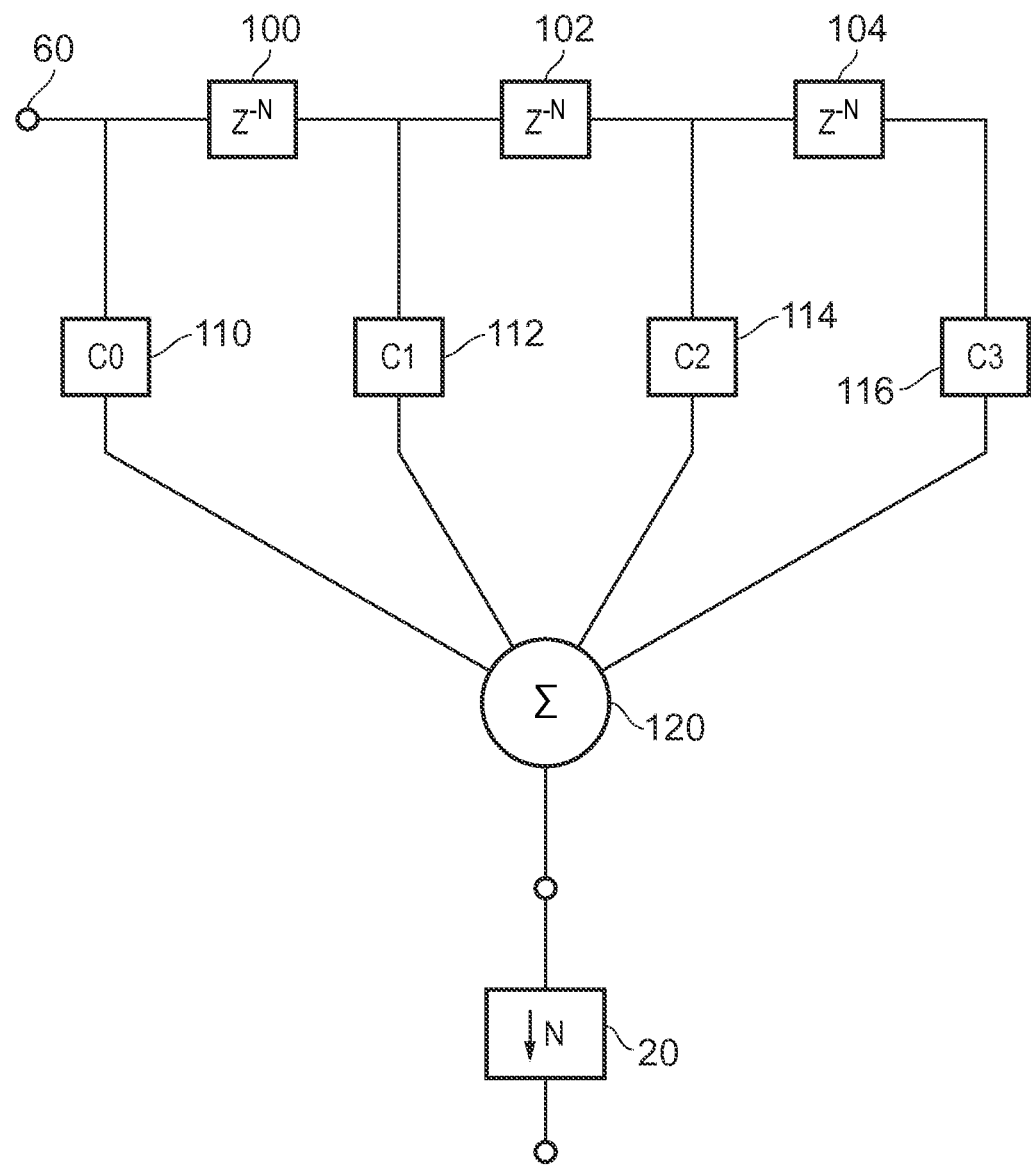
FIG. 3 is an example of a filter and sample rate converter constituting an embodiment of this disclosure and operable to replicate the functionality of the arrangement shown in FIG. 2.

The inventors realized that the circuit configuration shown in FIG. 2 could be modified to facilitate updating the differentiator 22, as schematically represented as shown in FIG. 3. The circuit shown in FIG. 3 is arranged to provide a third order differentiator function and comprises three delay stages 100, 102 and 104 arranged in series, and each stage having a delay of N clock cycles of the sample rate clock. The circuit further comprises four digital multipliers 110, 112, 114 and 116 each arranged to multiply the input provided to them by a fixed coefficient C0 to C3, respectively. An input signal at node 60, which corresponds to the output of the integrator 16 in FIG. 2 is provided to an input of the first delay element 100, and also to an input of the first multiplier 110. An output of the first delay element 100 is provided to an input of the second delay element 102 and also to an input of the second coefficient multiplier 112. An output of the second delay element 102 is provided to an input of the third delay element 104 and also to the third coefficient multiplier 114. An output of the delay element 104 is provided to an input of the fourth coefficient multiplier 116. The outputs of the coefficient multipliers 110, 112, 114 and 116 are provided as inputs to a summer 120 which sums them together and outputs a value representing an output of the differentiator.

Expansion of the term for the differentiation stage gives the coefficients to be used in each of the coefficient multipliers.

$$(1-Z^{-N})^3 = 1 - 3Z^{-N} + 3Z^{-2N} - Z^{-3N} \quad \text{(eqn 3)}$$

It can therefore be seen that the first multiplier 110 multiplies by a coefficient of unity, the second multiplier 112 multiplies by −3, the third multiplier 114 multiplies by +3 and the fourth multiplier 116 multiplies by −1. Thus, in hardware terms the first multiplier 110 can be omitted and the data signal passed straight through to the summer 120. Similarly, in a signed binary arithmetic, the third multiplier 116 can also be omitted and the sign bit output from the integrator 104 can be inverted. Therefore a practical implementation of the circuit could involve three delay stages, two multipliers, and summer. It also follows that the negation operations could be performed at the summer.

The output of the summer 120 is formed at the sample rate Fs and may be gated to output every Nth summation by decimator 20. The circuit shown in FIG. 2, and to some extent also in FIG. 3, works well whilst the decimation factor is held at a fixed value. However, in some circumstances it is desirable to provide an arrangement in which the decimation factor N can be varied whilst the circuit is in use. Changing the decimation factor in the circuit of FIG. 2 generally requires the counter of the decimator to count out one complete count of 3N input samples before the circuit output can be regarded as being reliable. Thus data already in the differentiators needs to be flushed out at each decimation rate change. Changing the decimation factor "on the fly" is possible in the arrangement shown in FIG. 3, but with the downside that the output from the circuit becomes unreliable until each of the three cascaded differentiators has flushed its data and settled to a new mode of operation. In general, this may result in quite a considerable settling window of around 3N input samples before the output becomes reliable again.

Figure 4:
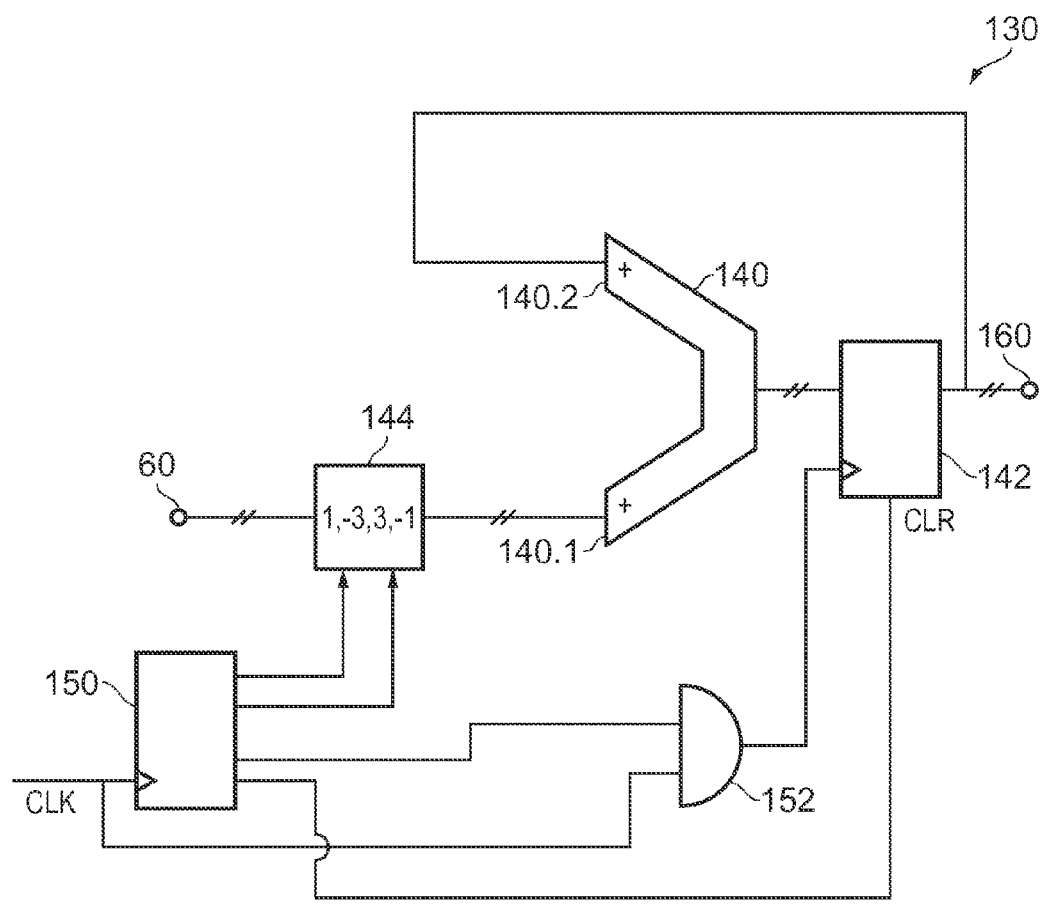
FIG. 4 is schematic diagram of a signal processing circuit suitable for performing the filter and sample rate conversion operation in accordance with this disclosure.

The inventors further realized that the circuit arrangement of FIG. 3 could be implemented efficiently using a multiply and accumulate circuit 130 to accept the integrator output and perform the decimation and differentiation function. Such an arrangement is shown in FIG. 4. The numeric processing circuit 130 shown in FIG. 4 comprises a two input digital adder 140 in combination with a multibit register 142 and a digitally controlled multiplier 144. Thus it performs a multiply and accumulate (MAC) function.

An input signal is applied at the input node 60 which, as before, is connected to the output of the integrator 16.

A controller 150, which may comprise a programmable ring counter, is arranged to receive a clock signal CLK. The clock signal and the output from the integrator are at the same data rate. Counting the clock by a programmable decimation factor N supplied to the ring counter allows the controller 150 to select every Nth word from the multibit input to be selected for accumulation.

The controller 150 also controls the multiplier 144 to change its multiplying coefficient after each Nth clock signal. The multiplier may be asynchronous and continuously powered such that it calculates a product for each input word that it receives. However as N−1 out of every N input words are discarded, the multiplier 144 may be clocked and/or powered to only operate on every Nth word. This reduces power consumption.

In use, the controller counts the incoming words and controls the multiplier such that an initial word, which can conveniently be called word 0, is multiplied by a coefficient C'0. The next N−1 words can be discarded or during this time the operation of the multiplier can be reconfigured such that the Nth word is multiplied by coefficient C'1. The next N−1 words can be discarded and/or the time used to reconfigure the multiplier such that the next Nth word (the 2Nth word) is multiplied by coefficient C'2, and then the multiplier is reconfigured such that the next Nth word (the 3Nth word) is multiplied by coefficient C'3.

The words which have been subject to a delay in the multiply and accumulate circuit 130 must have arrived at its input earlier in time and hence the circuit 130 synthesizes the function:

$$\text{Output} = -1Z^{-300} + 3Z^{-200} - 3Z^{-100} + 1Z^{-0} \quad (\text{eqn } 4)$$

Using an example where the decimation factor N is 100 (for simplicity) we effectively have to count-back as the multiply and accumulate circuit fills. A valid result will only be available after 300 input samples (in this example) and hence input word 300 gets multiplied by one as it is the "current" word. Input word 200 has been delayed by 100 time units, i.e. $Z^{-100}$ has been applied to it, so it needed to have been multiplied by −3. Input word 100 has been delayed by $Z^{-200}$ by the time input word 300 is available, and hence it needed to by multiplied by +3 whereas the first word, word 0 has been delayed by 300 time units ($Z^{-300}$) and hence needed to by multiplied by −1.

For the example shown of a third order filter we see the following table can be formed.

| Word No. | Coefficient | Value |
| --- | --- | --- |
| 0 | C'0 | −1 |
| N | C'1 | +3 |
| 2N | C'2 | −3 |
| 3N | C'3 | +1 |

Returning to FIG. 3 to consider its operation, it can be seen that the input words move continuously down the delay line. Consequently a continuous block of words is used, such that, for example, word 600 is combined with words 500, 400 and 300 to form a valid output. The next valid output comprises words 700, 600, 500 and 400. The next valid word comprises words 800, 700, 600 and 500, and the next valid word comprises words 900, 800, 700 and 600. In this example of a run of four valid outputs word 600 was used in the first and last examples, but with coefficients of −1 and +1 respectively.

In order to replicate this function in the circuit of FIG. 4 (without having to provide 2Q channels) every 3Nth word should be used twice, once to form the last word of a completing filter output, and once to form the first input of the next filter output. Since the magnitude of the coefficients C0 and C3 are the same, but the sign is different this is not computationally arduous since only a sign bit needs to be changed. In order to reduce the timing constraints on the circuit these "re-used" words, i.e. every QNth word, can be stored in a temporary memory (such as a further register—not shown), whilst the data from the register 142 is read out, and then the register 142 can be reset, so as to clear the MAC circuit 120 for reuse, and then the value stored in the further register can be loaded into the register 142 with the sign but inverted. This gives a window of greater than one clock cycle to read out, clear and process the first input of the next filter output calculation if such time is required. Alternatively the controller 150 may control the multiplier 140, the signal to the AND gate 152, and the register 142 to cause an output to be formed, passed to a subsequent circuit and then the MAC 120 to be reset, and then process the 3Nth signal for use twice, all within one clock (or more probably one half of a clock) cycle.

In general, for a Qth order filter selecting words from an input stream where the words are counted using a word count P.

Words P, (P+(Q)N), (P+(2Q)N), (P+(3Q)N) use coefficient C'3.

Words P+N, (P+(Q+1)N), (P+(2Q+1)N), (P+(3Q+1)N) use coefficient C'2.

Words P+2N, (P+(Q+2)N), (P+(2Q+2)N), (P+(3Q+2)N) use coefficient C'1, and so on.

Words P+3N, (P+(Q+3)N), (P+(2Q+3)N) use coefficient C'0.

The product of the input word and the coefficient is passed to the first input of the adder 140. The adder 140 may be arranged to be continuously powered and to calculate a new sum each time the first input changes. However, as only every Nth word will actually be processed the adder may be selectively depowered, and re-enabled with sufficient time to stabilize itself so that it processes each Nth word, to form a sum of the value at its first input 140.1 with the value presented at its second input 140.2.

The output of the adder is latched into the register 142 at every Nth input word, as counted by the controller 150 and gated with the clock CLK by an AND gate 152. The output from the register, which is a multibit register is supplied to an output node 160, and also to the second input of the adder 140. The register 142 and adder 140 cooperate to form an accumulator.

The register 142 is reset after the output word following the final accumulation in the filter response has been formed and output, such that a next series of 3N words (as Q=3) can be processed. The resetting may be performed by the controller 150 issuing a reset (or clear) command to the register 142.

Whilst the circuit shown in FIG. 4 is flexible it takes a full QN cycles to produce a valid result whereas the circuit at FIG. 3 can produce a valid result every N clock cycles.

In order to address this several accumulators need to be provided in parallel. In general Q accumulators need to be provided in parallel. For convenience this can be regarded as providing Q channels for data processing. More than Q channels (or more than Q MACs) may be provided to simplify the re-use of every QNth word, as the outputs can be selected from a sequence of 2Q MACs, for example.

Figure 5:
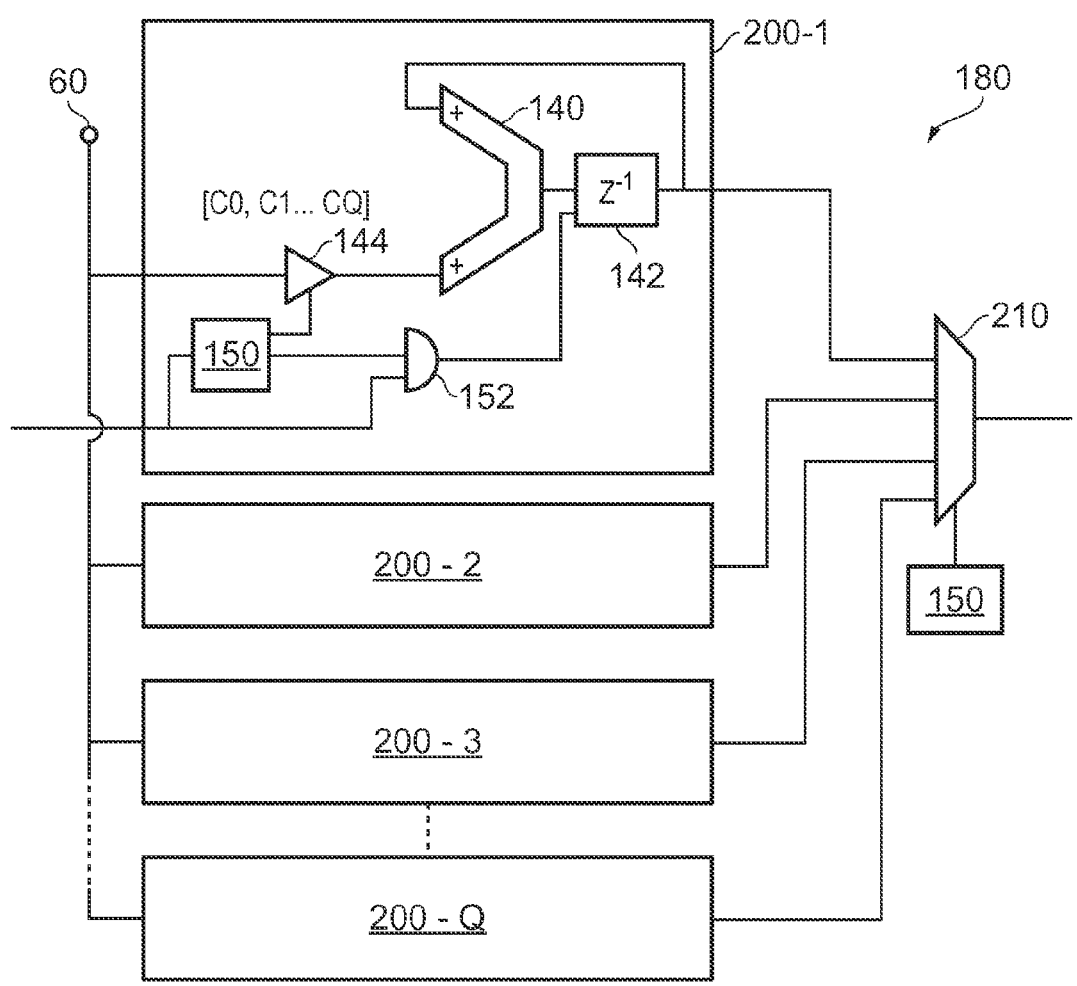
FIG. 5 is a schematic diagram of a filter and sample rate converter having plurality of channels which are selected in a sequential manner and constituting an embodiment of this disclosure.

FIG. 5 shows such an arrangement of a multi-channel sample rate converter 180 in which the multiplier-accumulator (MAC) 120 of FIG. 4, and now designated 200-1 is repeated several times, 200-2, 200-3, and so on to 200-Q. Thus for a third order filter only channels 200-1, 200-2 and 200-3 are required. Each multiplier-accumulator channel is connected to a respective input of a multiplexer 210 which is responsive to the controller 150.

The controller 150 staggers the operation of the channels so that they are offset by N clock cycles from one channel to the next. Thus the three channels can provide the functionality of the circuit of FIG. 3.

Figure 6:
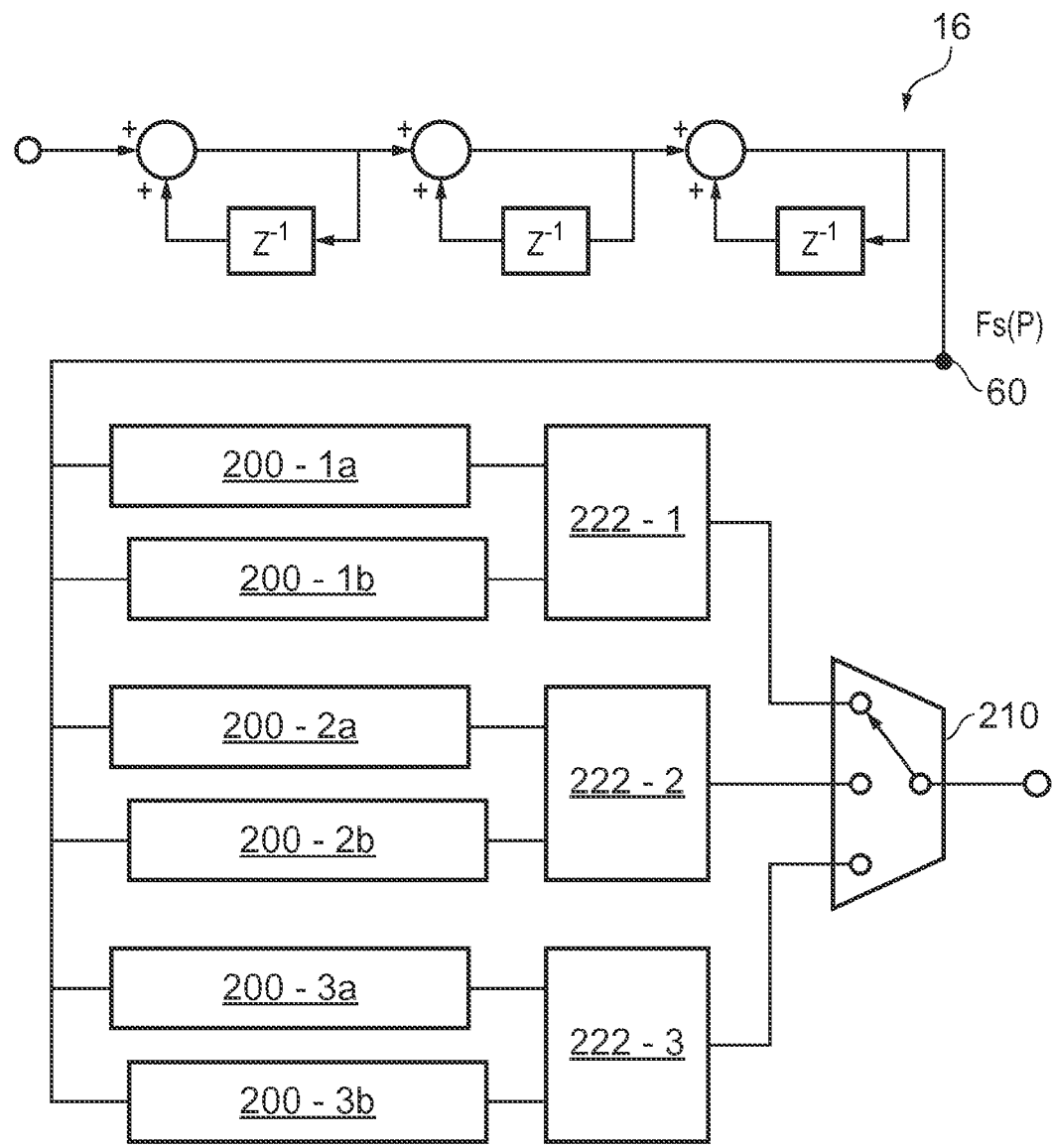
FIG. 6 is a circuit diagram of a filter and sample rate converter wherein a plurality of channels are provided, each channel including respective first and second processing circuits together with a processor for combining their results in order to allow for use of fractional "non-integer" decimation factors.

In a further variation a second multiply accumulate circuit may the placed in parallel with each of the multiply and accumulate circuit shown in FIG. 5. Such an arrangement is shown in FIG. 6. In this arrangement the first channel 200-1 of FIG. 5 is now implemented as two MACs 200-1a and 200-1b, which may be regarded as sub-channels within a channel. Each MAC 200-1a and 200-1b is as descried with respect to FIG. 4. However, now each MAC is connected to a combining circuit such as an interpolator 222-1 which can combine the outputs of the first channel and second MACs 200-1a and 200-1b in a weighted manner. The weighting is adjustable in response to the controller.

Such an arrangement allows fractional decimation values to be synthesized.

Suppose, for example, that the integrator 16 is outputting words at a rate Fs, and that each word is identified by an index P. The decimator may get an instruction to start decimating by N as it starts this process upon receipt of a word $P_E$, where E is an integer which could for simplicity be 1 (or 0) if we were not considering a generalized case.

N may be a non-integer number, which can be divided up into an integer part S and a fractional or decimal part R. If, for example, N=640.375, then S=640 and R=0.375.

The controller loads the value S as the decimation factor into the first MAC 200-1a within the first channel 200-1. Similarly it loads the same decimation factor S into the second MAC 200-1b of the first channel. However, the controller 150 controls the MACs 200-1a and 200-1b such that they operate on samples that are temporally offset from one another. Consequently if the first MAC 200-1a starts processing at receipt of word $P_E$ the second MAC 200-1b in the first channel starts processing upon receipt of word $P_{E+1}$.

Loading the channels with the same decimation factor S means that the channels maintain synchronism, i.e., the offset of one word, irrespective of how many output words they provide. This is to be contrasted with loading one channel with S, e.g. 640, and loading the other channel with S+1, e.g., 641, where after ten complete output words the channels would be QN, e.g., 30 input words out of data alignment.

The outputs of the two channels 200-1a and 200-1b are combined at the interpolator 222-1 in a weighted fashion.

The interpolator may use a variety of approaches to interpolate the outputs of each MAC. In one approach it may form a weighted sum of the output M1 of the first MAC, with an output M2 of the second MAC in accordance with $$output=M1(1-R)+M2(R)$$

which requires non-integer multiplications to be performed on M1 and M2 or it may form $$output=M1+(M2-M1)R$$

This latter approach only requires one non-integer multiplication so it is easier to perform in hardware. Other interpolation approaches may be used as appropriate.

A problem with interpolation is that it needs continual correction to accurately synthesize the non-integer decimation.

Suppose a synthesized decimation factor of 600.3 is required. If we simply count every 600th word, and use the circuit of FIG. 6 to interpolate the 0.3 part we could calculate outputs corresponding to sample positions of 0; 600.3; (2×600)+0.3=1200.3; (3×600)+0.3=1800.3; 2400.3; 3000.3; 3600.3 etc However, the true values should be multiples of the non-integer decimation factor, eg 0, 600.3, 1200.6, 1800.9, 2401.2, 3001.5, 3601.8

An error of 0, 0, 0.3, 0.6, 0.9, 1.2, 1.5, 1.8 and so on exists.

These errors can be removed by dynamically updating the values of S and R used in each channel, thereby synthesizing the correct result for a non fractional N.

The error can be mapped to updating S and R as follows:

| | Error | | | | | | |
|---|---|---|---|---|---|---|---|
| | 0.3 | 0.6 | 0.9 | 1.2 | 1.5 | 1.8 | 2.1 |
| R | 0.3 | 0.6 | 0.9 | 0.2 | 0.5 | +0.8 | 0.1 |
| S | +0 | +0 | +0 | +1 | +0 | +0 | +1 |

Put another way a running interpolation factor RIF can be calculated as $$RIF_N = RIF_0 + R$$

where $RIF_N$ is a new interpolation factor and $RIF_0$ is the current interpolation factor. Furthermore if $MOD(RIF_N)$ is different from $MOD(RIF_0)$ where MOD is a modulus function that evaluates the integer only part of a non-integer number, then $RIF_N$ is decremented and S is incremented.

It also follows that a non-integer decimation factor can be calculated by picking the next highest integer value, and using the interpolation circuit to calculate a negative non-integer part, either by interpolation or extrapolation.

Thus N=640.375 may be formed from S=641 and R=−0.625.

The running interpolation factor scheme can then be modified to take account of this, with S being occasionally decremented each time $MOD(RIF_N)$ differs from $MOD(RIF_0)$.

In some circumstances it may be desirable to switch between these schemes such that the value of S is constrained to lie with a given range of values from N. This helps avoid any counter overflow problems within the controller.

Figure 7:
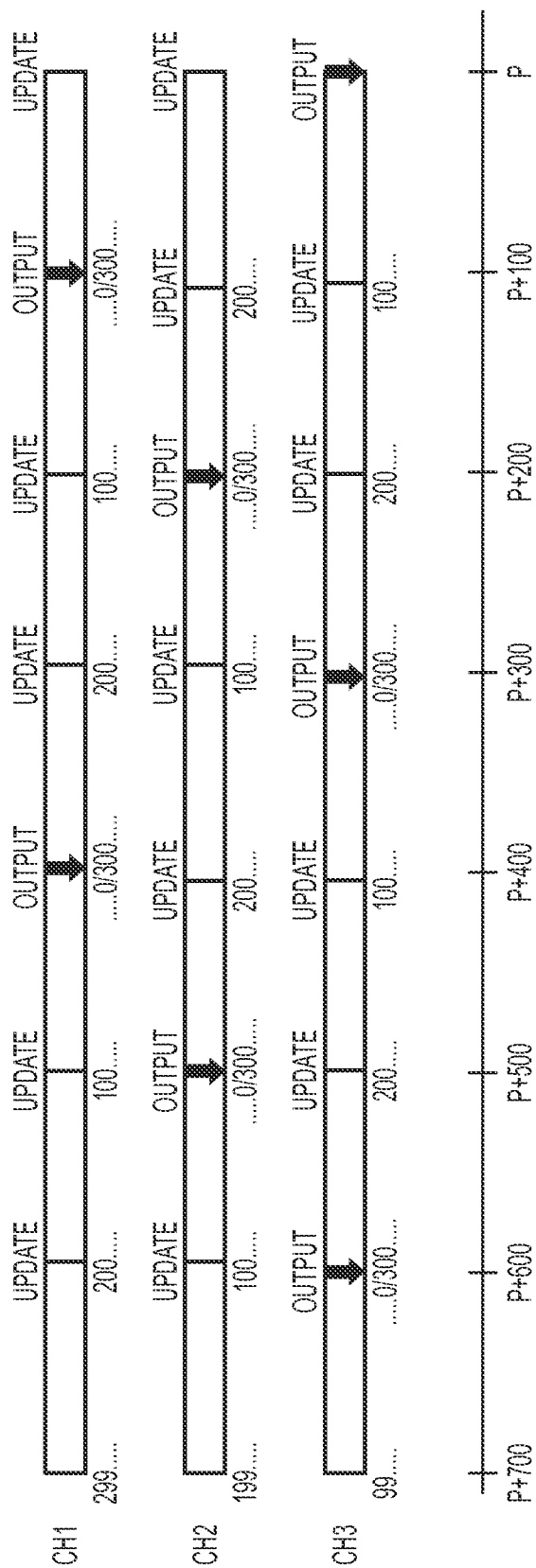
FIG. 7 is a timing diagram showing operation of an embodiment during a steady state.

FIG. 7 is a timing diagram for the circuit of FIG. 5 when operating in a steady state, such that N is constant from one output to the next. This timing diagram also holds true of the circuit shown in FIG. 6 where N is constant (and hence S is constant).

For simplicity a decimation factor of N=100 has been chosen. The filters have been running for a while, such that an output occurs on the third channel 200-3, represented in FIG. 7 and CH3, in response to receipt of word P. The third channel then resets and loads word P as the first input word in a new run of 300 words. The third channel updates at word P+100 and P+200, and completes a calculation and outputs a new output value in response to word P+300. This cycle repeats so the next output from the third channel occurs in response to receipt of word P+600.

Meanwhile the first and second channels operate in a similar manner but offset from each other channel by N input words. Therefore, in this example the first channel 200-1, and represented as CH1 here, outputs valid results in response to input words P+100, P+400, P+700 and so on. The second channel 200-2 and represented here as CH2 outputs valid results at P+200, P+500, P+800 and so on.

Importantly the decimation factor can be changed on the fly from an old value OLD_N or N1 to a new value NEW_N or N2. However it is also advantageous for the channels to maintain their equal offsets. Thus for a third order filter working on a first decimation value "OLD_N" the filter works on 3×OLD_N values per output. If the filter is updated to work on a decimation value, "NEW_N" then eventually it, and all of its channels, will work on 3×NEW_N values per output.

Each channel should complete a calculation based on OLD_N before switching to NEW_N in order to maintain proper temporal and data alignment and to avoid producing spurious results.

However, with care, the transition can be made in such a way that reduces or avoids data misalignment.

Figure 8:
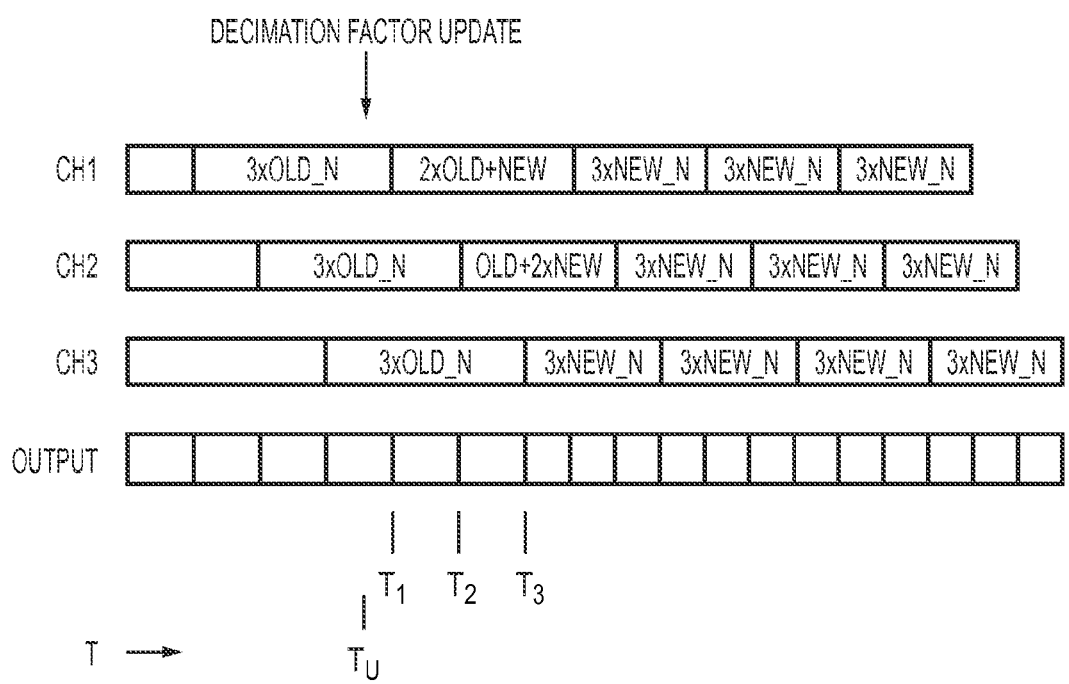
FIG. 8 shows an update sequence that may be used to reduce latency when transitioning from one output data rate to a new output data rate.

FIG. 8 shows a timing diagram in which the first to third channels are operating with a decimation factor OLD_N such that each channel takes 3×OLD_N to perform a third order Sinc function. The decimation factor is updated at time Tu to NEW_N. In this example the first channel to complete its calculation is CH1, at time $T_1$ which is after Tu. The channel can start work using the new decimation factor NEW_N (NEW_N<OLD_N) immediately. However although the result in this example is available after three NEW_N cycles, it is not output (or not used) until (2×OLD_N)+NEW_N input words/clock cycles have completed.

The second channel is the next channel to finish, and it is loaded with NEW_N but its output is not issued (or consumed) until OLD_N+(2×NEW_N) clock cycles have passed.

Finally the third channel does not need its output delayed.

Figure 9:
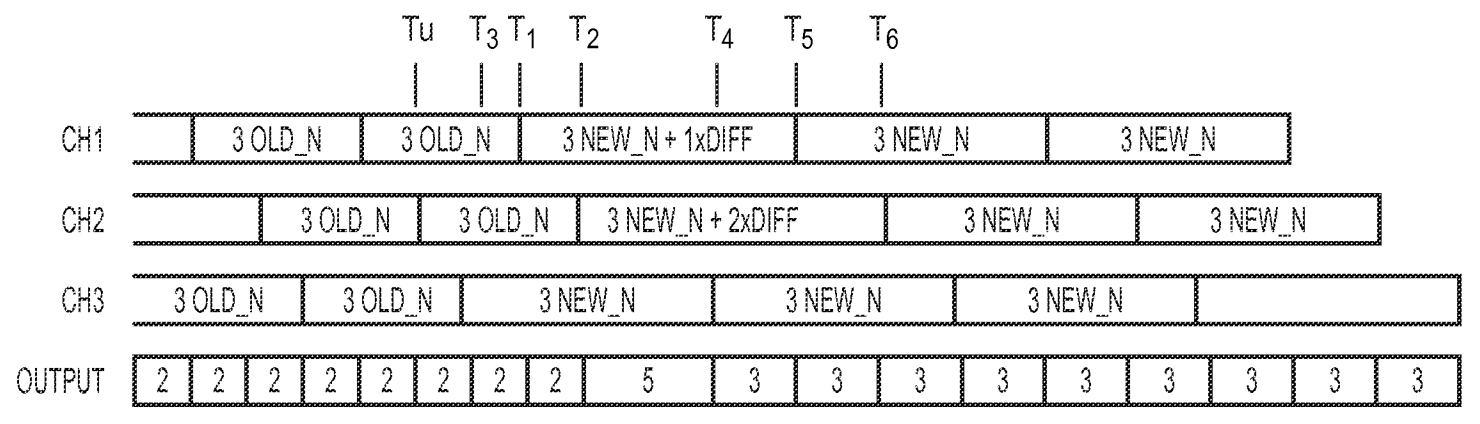

FIG. 8 showed the update sequence for a third order filter where the decimation factor OLD_N was greater than the decimation factor NEW_N. FIG. 9 shows an example of a transition sequence where OLD_N is less than NEW_N. As before, a decimation factor update is requested at time Tu. In this example, the third channel CH3 is the first channel to complete its calculation, time $T_3$. It is immediately loaded with a new decimation factor such that its new Sinc filter calculation will become available at time $T_4$. The next channel to finish calculation after time Tu is channel CH1 at time $T_1$. In this example it immediately switches to using the new decimation factor NEW_N, but its output is delayed, or not consumed, until a period (or number of input data cycles) corresponding to 3NEW_N+diff where diff=NEW_N−OLD_N. As a result the output of the first channel becomes available at time $T_5$. The next channel to finish its calculation after the update Tu is channel CH2 with its calculation finishing at time $T_2$. It is loaded with the new decimation factor NEW_N, but its output is not asserted or consumed until a further time period corresponding to 3NEW_N+2 diff has passed. Thus the output becomes available time $T_6$. Using the sequence means that there is only one transitional period spanning between times $T_2$ and $T_4$ where the outputs from the system as a whole are not evenly spaced. Thus the outputs up to time $T_2$ are evenly spaced, and the outputs after time $T_4$ are evenly spaced.

Figure 10A:
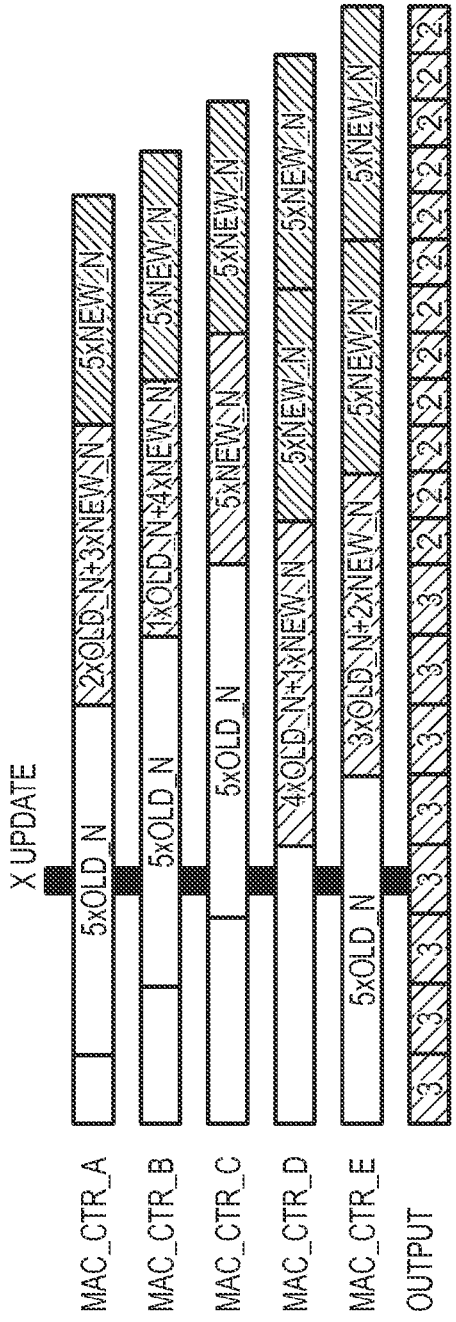
FIGS. 10a and 10b show further update sequences for transitioning between data rates.
Figure 10B:
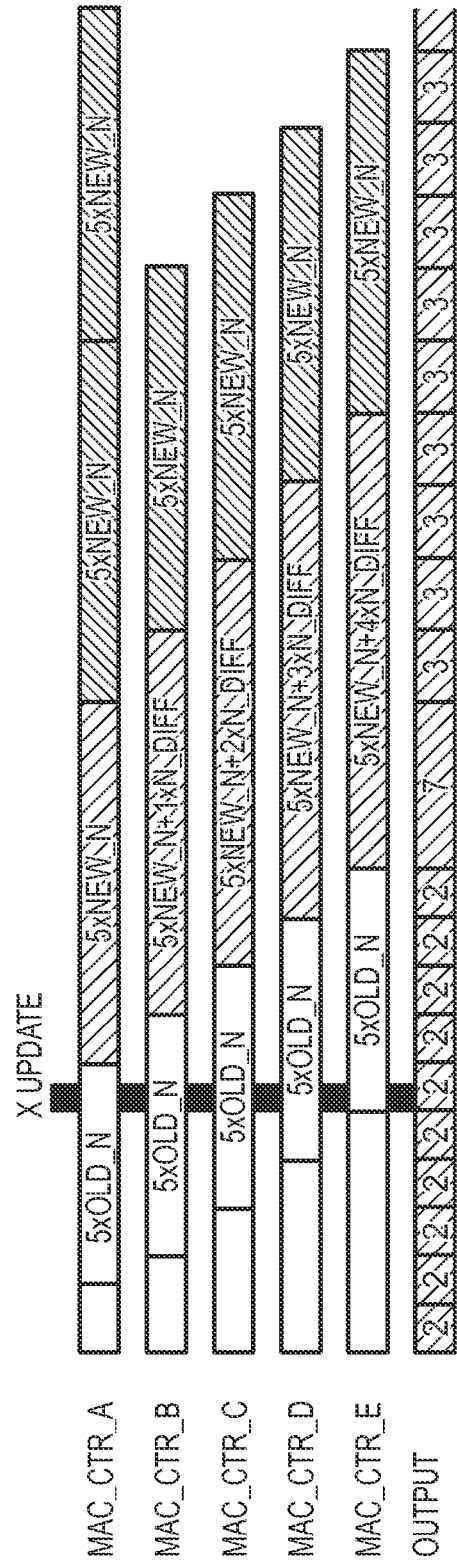
Figure 11:
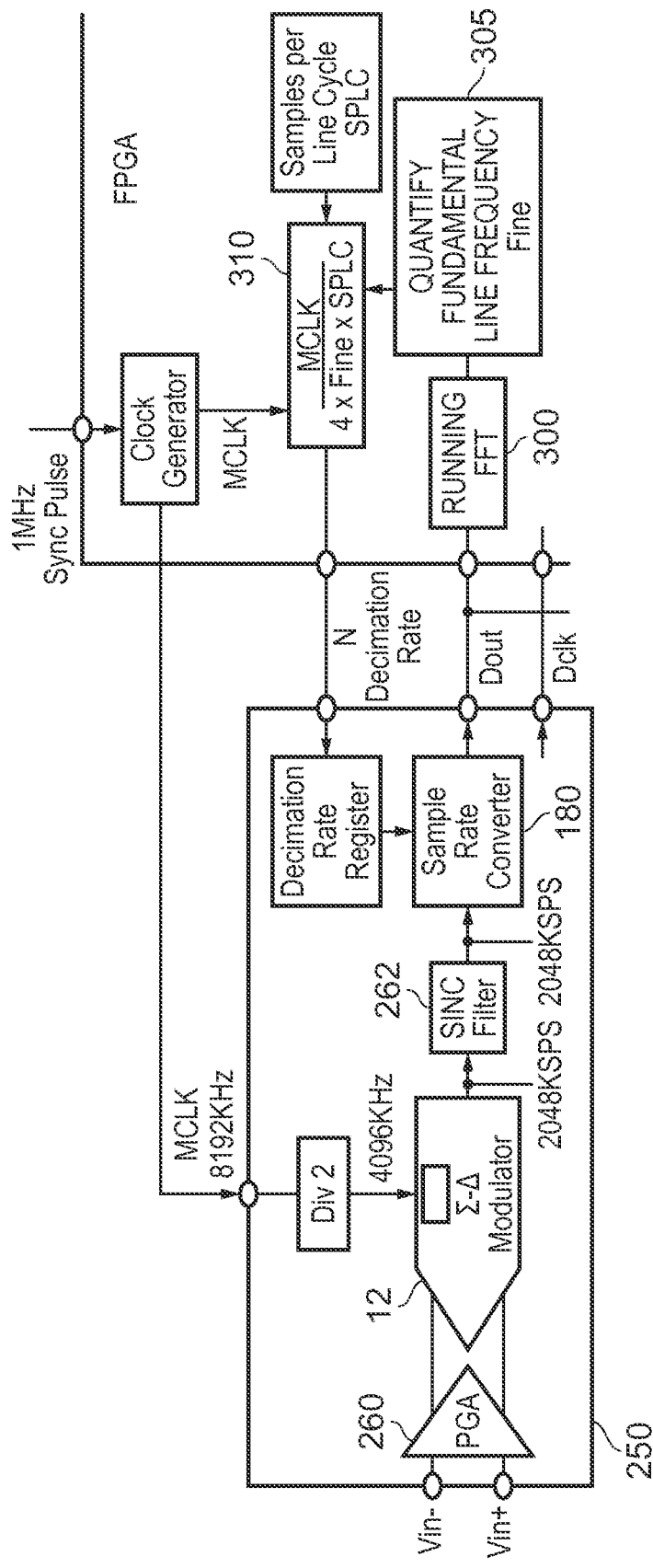
FIG. 11 shows a sample rate converter provided as part of an analog to digital converter.

The present disclosure is not limited to use with third order filters and FIGS. 10a and 10b show equivalent transitional schemes. FIG. 10a shows the situation for transitioning from OLD_N to NEW_N where OLD_N is greater than NEW_N. FIG. 10b shows the corresponding situation for transitioning to a NEW_N where OLD_N is less than NEW_N.

This can be generalized as when changing from N1 to N2 (where as set out before N1 is the old N value and N2 is the new N value) such that when N1 is greater than N2, each channel output is delayed during a transitional count for that channel by a delay selected from AN1+BN2 where A+B=Q; and when changing from N1 to N2 where N1 is less than N2 the channel delays during the transition are selected from QN2 to QN2+A'(N2−N1) where A' is an integer between 1 and Q−1.

The sample rate converter, including the integrator 16 and combined decimator and Sinc filter 180 may be provided as individual components or within a single integrated circuit package. The sample rate converter may be provided as part of an analog to digital converter (ADC), as shown in FIG. 9, of some other signal processing component. In FIG. 9 a differential input may be subjected to gain in a programmable gain amplifier 260 and then supplied to inputs of a sigma-delta converter 12. The output of the converter 12 may be filtered by a Sinc filter 262 which may form the integrator 16.

In the context of monitoring a power line, the output of the ADC is subjected to a running fast Fourier transform (FFT) by circuit 300 and this is used by circuit 305 to identify the fundamental frequency of the AC signal. This is provided to a data processor 310 which calculates the required decimation factor to maintain the number of samples per cycle at a desired value.

In the example considered so far of a third order filter, there are effectively three "N" values, each of which produces a notch in the filter response at F=Fs/N. In the above example all three values of N are equal. This creates a deep notch at one frequency.

However, the values of N between adjacent "taps" in the filter response need not be equally spaced. This allows other filter responses, such as filters with multiple notches to be provided. This will require the number of summations and multiplications to produce a valid output to vary.

To provide a filter with an output given by output=−1$Z^{-250}$+$Z^{-200}$+2$Z^{-150}$−2$Z^{-100}$−$Z^{-50}$+1$Z^{-0}$ requires combining six terms. In this example the terms are all spaced apart by 50 input words. This can be achieved by loading the controller with appropriate counting values, i.e values of N. It should be noted that the apparatus disclosed herein does not impose a requirement for the samples to always be equally spaced. For example a 3rd order filter can be created using N values between adjacent filter taps of 100, 70 and 60 giving rise to a transfer characteristic:

$$F(Z)=-Z^{-230}+Z^{-170}+Z^{-160}+Z^{-130}-Z^{-100}-Z^{-70}-Z^{-60}+Z^{-0}$$

Thus the filter designer is free to implement complex filter designs within a relatively compact hardware unit.

It is thus possible to provide an improved sample rate converter. The sample rate converter can be implemented with readily available and compact hardware processing blocks, and is flexible and robust in operation and allows outputs to be continually available, i.e. no outputs are lost due to a need to flush data from the delay elements before a new decimation factor can be implemented.

The claims presented here are in single dependency format suitable for filing with the United States Patent and Trademark Office. However it is to be understood that each claim is intended to be dependent on any preceding claim of the same type, except where that is clearly technically infeasible.

What is claimed is:

1. A sample rate converter arranged to receive digital data at an input sample rate $F_s$ and to output data at an output data at an output rate $F_o$, where $F_o=F_s/N$, and N is a decimation factor greater than one, the sample rate converter including at least Q channels,
   each channel comprises a Qth order filter arranged to select input signals at predetermined intervals from a run of P input samples, and to form a weighted sum of the selected input signals to form an output value, and where the runs of P input samples of one channel are offset from the samples of the other channels.

2. A sample rate converter as claimed in claim 1, wherein in a steady state where N is non-changing between a plurality of runs of P input signals, P=Q.N.

3. A sample rate converter as claimed in claim 1, in which the filter is a $Q^{th}$ order filter, and each filter forms a sum of at least Q+1 input samples.

4. A sample rate converter as claimed in claim 3, in which the selected input signals are every $N^{th}$ input signal.

5. A sample rate converter as claimed in claim 1, where the weighted sum is formed by a multiply and accumulate operation, and the accumulator is reset to an initial value at the start of each run of samples.

6. A sample rate converter as claimed in claim 1, in which the decimation factor can be changed from a first value N1 to a second value N2 while the sample rate converter is operating, and each channel is allowed to finish processing of an in progress weighted sum using the decimation factor N1 before being instructed to process using a new decimation factor N2.

7. A sample rate converter as claimed in claim 6 in which for a three stage filter three channels are provided, and following receipt of an instruction to change the decimation factor from N1 to N2, the first channel to finish forming its weighted sum counts out 2N1+N2 samples in a subsequent processing operation before outputting its result, the second channel to finish forming its weighted sum counts out N1+2N2 samples in a subsequent processing operation before outputting its result and the third channel to finish forming its weighted sum outputs its next result after 3N2 samples.

8. A sample rate converter as claimed in claim 6 having Q channels, each being a Q stage filter, wherein when changing from N1 to N2 where N1 is greater than N2, each channel output is delayed during a transitional count for that channel by a delay selected from AN1+BN2 where A+B=Q; and when changing from N1 to N2 where N1 is less than N2 the channel delays during the transition are selected from QN2 to QN2+A'(N2−N1) where A' is an integer between 1 and Q-1.

9. A sample rate converter as claimed in claim 1, in which each channel comprises first and second processing circuits arranged to form first and second respective sums from respective runs of P input samples, and where the runs of P input samples are offset from each other.

10. A filter and sample rate converter as claimed in claim 9 in which the outputs of the first and second processing circuits within a channel are combined so as to synthesize a non-integer decimation factor.

11. A sample rate converter as claimed in claim 9, in which the decimation factor N is comprised of an integer part S and a non-integer part R, and the combining circuit combines the outputs of the first and second processing circuits based on the value of R.

12. A sample rate converter as claimed in claim 11, further including or responsive to a processing device arranged to calculate modifications to the values of S and R.

13. A sample rate converter as claimed in claim 1, further comprising a Qth order integrator preceding the channels.

14. An analog to digital converter comprising a sigma-delta modulator in combination with a filter and sample rate converter as claimed in claim 1.

15. An integrated circuit including a sample rate converter as claimed in claim 1.

16. A method of performing sample rate conversion, comprising receiving a signal to be decimated, and processing the signal in at least Q channels, each channel containing at least Q differentiators in series, and where each channel selects at least Q+1 integrated input signals from the run of P signals to form a weighted sum, and the runs of P signals in the channels are offset from one another.

17. A method as claimed in claim 16, in which the channels are offset from each other by S samples, where S is an integer part of a decimation factor N.

18. A method as claimed in claim 17, in which each channel comprises at least two sub-channels operating on respective runs of P signals, said runs being offset by an integer number of input signals, and where the outputs of the sub channels are combined to estimate an output corresponding to an non-integer decimation factor.

19. A method as claimed in claim 18, in which a correction is calculated for S and also for a combining ratio R so as to synthesize a plurality of correctly calculated outputs for a non-integer decimation factor.

20. A tangible medium for storing instructions to cause a data processor to perform sample rate conversion as claimed in claim 16.

* * * * *